(12) United States Patent
Luster

(10) Patent No.: US 10,658,800 B1
(45) Date of Patent: May 19, 2020

(54) POWER SUPPLY ASSEMBLY

(71) Applicant: Trinise Luster, Douglasville, GA (US)

(72) Inventor: Trinise Luster, Douglasville, GA (US)

(73) Assignee: Trinise D. Luster, Douglasville, GA (US)

( * ) Notice: Subject to any disclaimer, the term of this patent is extended or adjusted under 35 U.S.C. 154(b) by 0 days.

(21) Appl. No.: 16/253,788

(22) Filed: Jan. 22, 2019

(51) Int. Cl.
| | |
|---|---|
| *H01R 13/72* | (2006.01) |
| *H05K 5/02* | (2006.01) |
| *H01R 13/642* | (2006.01) |
| *H01R 13/717* | (2006.01) |
| *B65H 75/48* | (2006.01) |
| *H01R 31/06* | (2006.01) |

(52) U.S. Cl.
CPC ........... *H01R 13/72* (2013.01); *B65H 75/486* (2013.01); *H01R 13/642* (2013.01); *H01R 13/717* (2013.01); *H01R 31/06* (2013.01); *H05K 5/0217* (2013.01); *H05K 5/0247* (2013.01); *B65H 2701/34* (2013.01)

(58) Field of Classification Search
CPC ........ H01R 35/04; H01R 13/72; H02G 11/02; B65H 2701/34
See application file for complete search history.

(56) References Cited

U.S. PATENT DOCUMENTS

| | | | |
|---|---|---|---|
| D383,439 S | 9/1997 | Tremmel | |
| 6,402,546 B1 * | 6/2002 | Groves | H01R 13/72 439/172 |
| 6,575,781 B2 | 7/2003 | Wen-Hsuan | |
| 6,664,758 B2 * | 12/2003 | Yang | H02J 7/0006 320/107 |
| 6,702,077 B2 | 3/2004 | Skowronski | |
| 6,741,475 B1 | 5/2004 | Chuang | |
| 6,806,682 B2 * | 10/2004 | Hsiao | H02J 7/0042 320/107 |
| 6,994,592 B1 * | 2/2006 | Gannon | H01R 31/065 320/111 |
| 7,035,126 B1 * | 4/2006 | Lanni | H01R 31/065 363/142 |
| 7,183,743 B2 * | 2/2007 | Geiger | B60R 11/02 320/111 |
| 7,200,004 B2 | 4/2007 | Chen | |
| 7,893,657 B2 * | 2/2011 | Chavakula | H02J 7/0055 320/138 |
| 9,917,453 B1 * | 3/2018 | Banon | H02J 7/0042 |
| 10,050,453 B2 * | 8/2018 | Miller | H02J 7/0042 |

(Continued)

*Primary Examiner* — Ross N Gushi

(57) ABSTRACT

A power supply assembly for powering and recharging an electronic device includes a power supply unit that is positioned in a housing. The power supply unit is configured to convert alternating current to direct current. A first plug that is operationally coupled to the power supply unit is configured to couple the power supply unit to a source of alternating current. A cord is selectively extensible from and retractable into the housing. The cord is operationally coupled to the power supply unit. A first coupler is coupled to the cord and is positioned external to the housing. Each of a plurality of adaptors is configured to couple a respective electronic device through the first coupler and the cord to the power supply unit. The power supply unit is configured to supply the direct current to power the respective electrical device and to recharge a battery of the respective electrical device.

14 Claims, 5 Drawing Sheets

(56) References Cited

U.S. PATENT DOCUMENTS

| | | | |
|---|---|---|---|
| 10,320,210 B2 * | 6/2019 | Miller | H02J 7/0042 |
| 2011/0215759 A1 * | 9/2011 | Lee | G06F 1/266 |
| | | | 320/115 |
| 2012/0064759 A1 | 3/2012 | Liu | |
| 2012/0320546 A1 * | 12/2012 | Wu | H01R 31/065 |
| | | | 361/755 |

* cited by examiner

POWER SUPPLY ASSEMBLY

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT GEAR OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

(2) Description of Related Art Including Information Disclosed Under 37 CFR 1.97 and 1.98

The disclosure and prior art relates to power supply assemblies and more particularly pertains to a new power supply assembly for powering and recharging an electronic device.

BRIEF SUMMARY OF THE INVENTION

An embodiment of the disclosure meets the needs presented above by generally comprising a power supply unit that is positioned in a housing. The power supply unit is configured to convert alternating current to direct current. A first plug that is operationally coupled to the power supply unit is configured to couple the power supply unit to a source of alternating current. A cord is selectively extensible from and retractable into the housing. The cord is operationally coupled to the power supply unit. A first coupler is coupled to the cord and is positioned external to the housing. Each of a plurality of adaptors is configured to couple a respective electronic device through the first coupler and the cord to the power supply unit. The power supply unit is configured to supply the direct current to power the respective electrical device and to recharge a battery of the respective electrical device.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
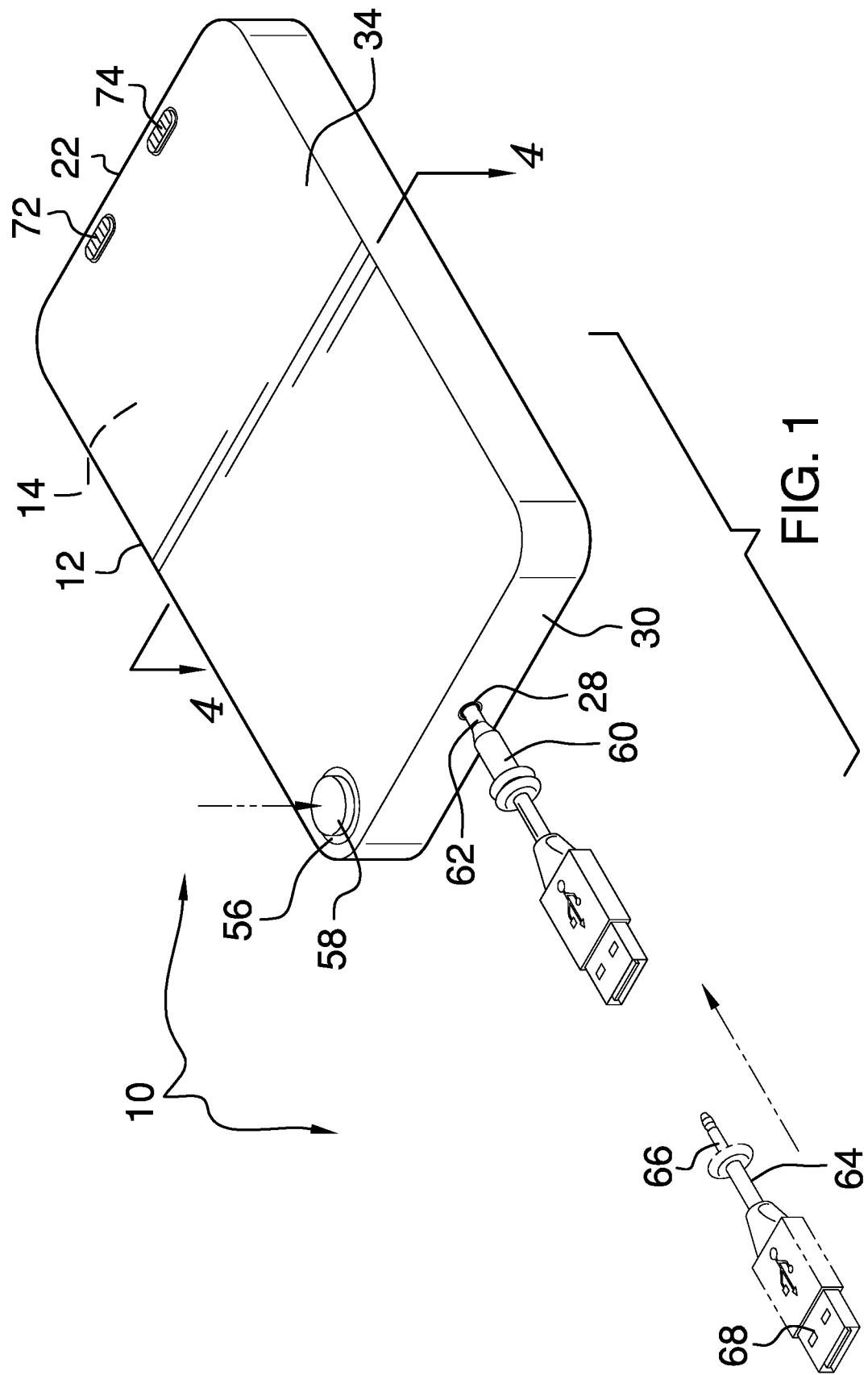
FIG. 1 is an isometric perspective view of a power supply assembly according to an embodiment of the disclosure.

With reference now to the drawings, and in particular to FIGS. 1 through 6 thereof, a new power supply assembly embodying the principles and concepts of an embodiment of the disclosure and generally designated by the reference numeral 10 will be described.

Figure 3:
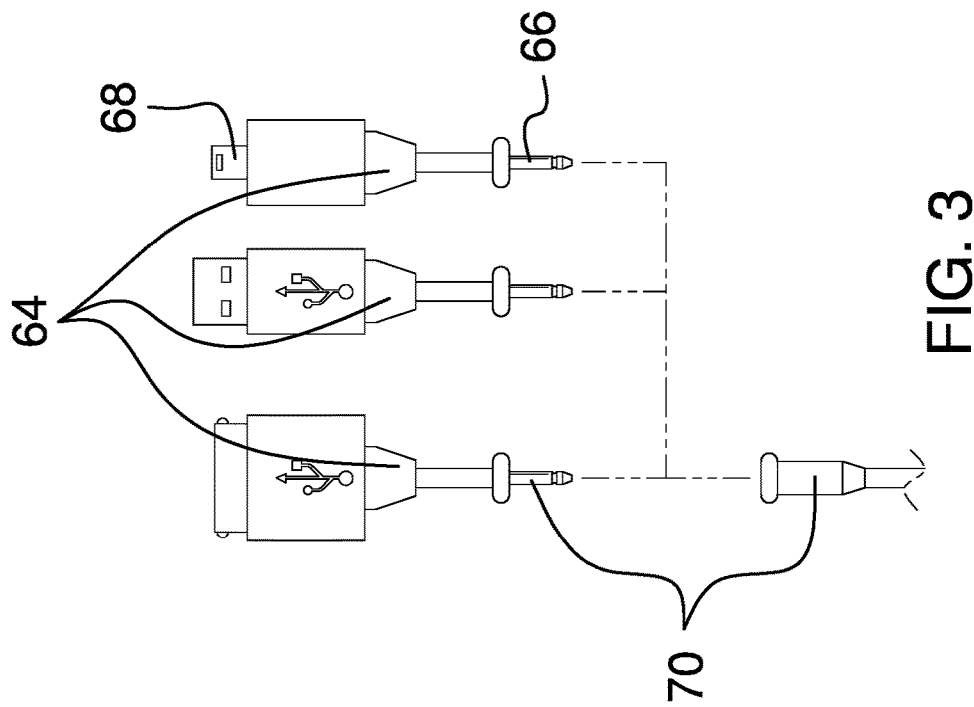
FIG. 3 is a detail view of an embodiment of the disclosure.
Figure 4:
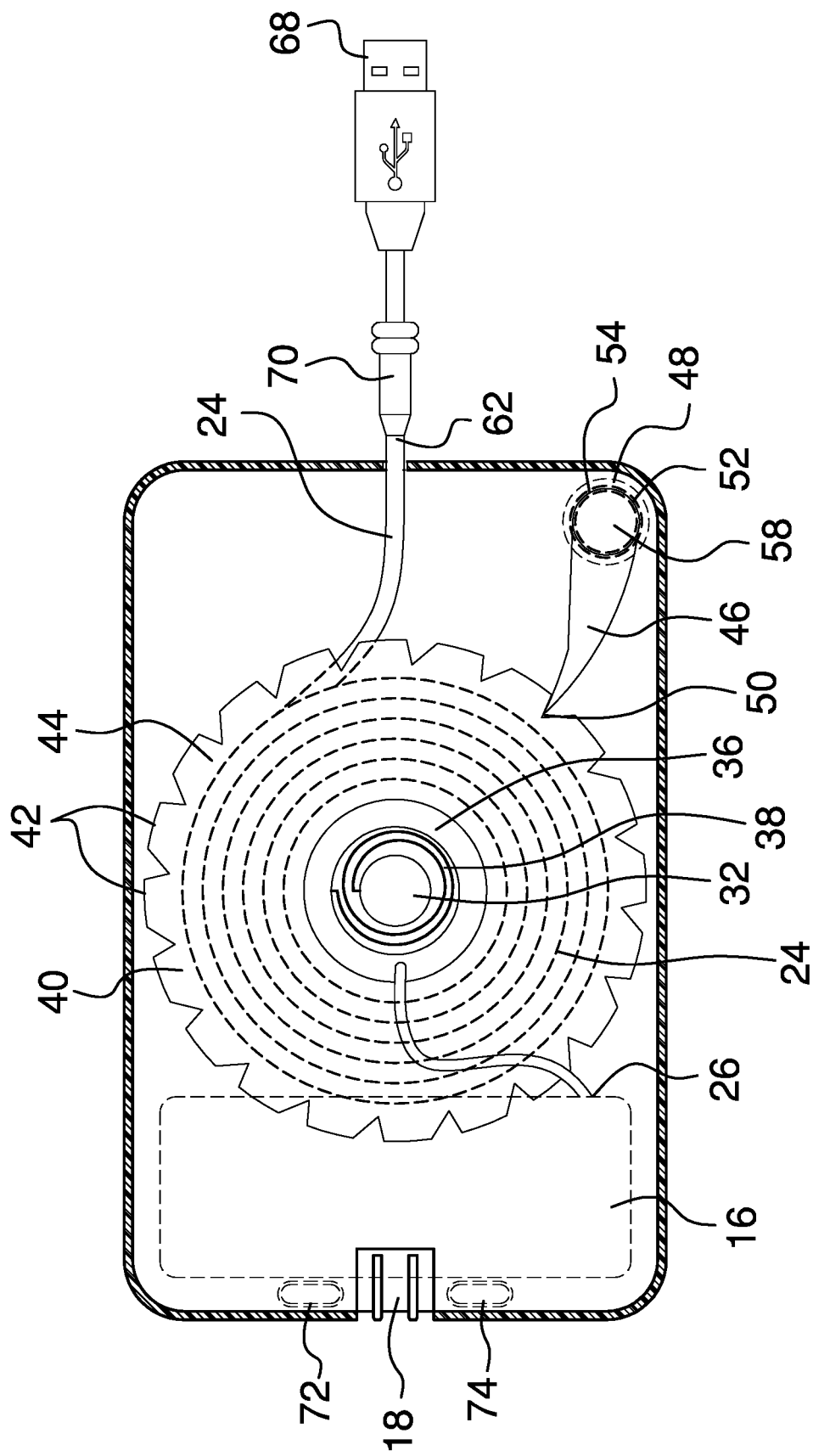
FIG. 4 is a cross-sectional view of an embodiment of the disclosure.
Figure 5:
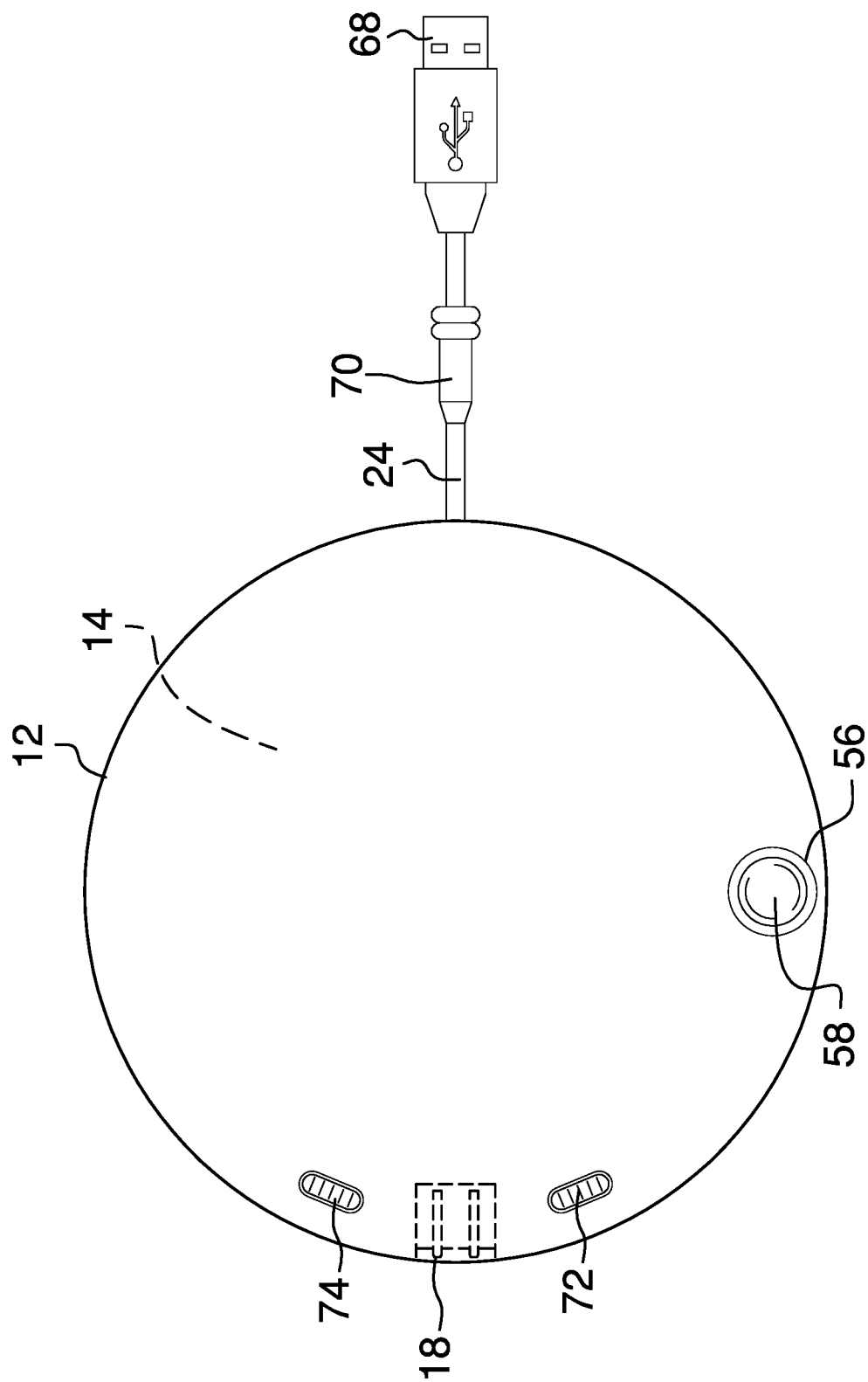
FIG. 5 is a front view of an embodiment of the disclosure.

As best illustrated in FIGS. 1 through 6, the power supply assembly 10 generally comprises a housing 12 that defines an interior space 14. The housing 12 has a shape that is selected from the set of shapes consisting of rectangular box shaped, as shown in FIG. 1, and disc shaped, as shown in FIG. 5.

A power supply unit 16 is coupled to the housing 12 and is positioned in the interior space 14. The power supply unit 16 is configured to convert alternating current to direct current. The power supply unit 16 comprises components that are well known to those skilled in the art, such as a transformer, a bridge rectifier, and an electrolytic capacitor. The present invention also anticipates the power supply unit 16 being configured to have an adjustable output so that the direct current supplied is adjustable to meet the requirements of a variety of electronic devices.

Figure 2:
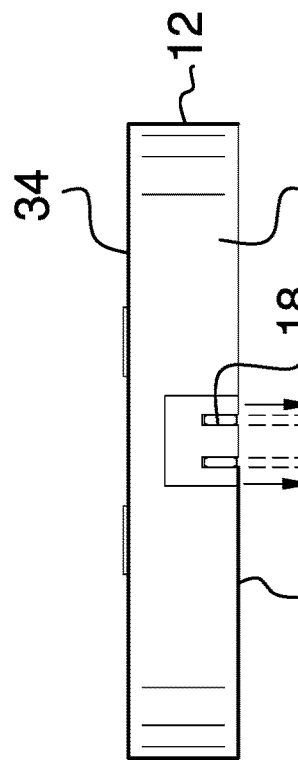
FIG. 2 is a top view of an embodiment of the disclosure.

A first plug 18 is coupled to the housing 12. The first plug 18 is operationally coupled to the power supply unit 16. The first plug 18 is configured to couple the housing 12 to an outlet and to couple the power supply unit 16 to a source of alternating current. The first plug 18 is pivotally coupled to the housing 12, as shown in FIG. 2. The first plug 18 is positioned on a back 20 of the housing 12 proximate to a top 22 of the housing 12.

A cord 24 is positioned in the interior space 14 and is selectively extensible from and retractable into the housing 12. The cord 24 has a first end 26 that is operationally coupled to the power supply unit 16.

A first hole 28 is positioned through the housing 12. The first hole 28 is positioned in a bottom 30 of as shown in FIG. 4. The cord 24 is positioned through the first hole 28. A rod 32 is positioned in the interior space 14, as shown in FIG. 4. The rod 32 is coupled to and extends between the back 20 and a front 34 of the housing 12. A tube 36 is positioned around the rod 32. The cord 24 is coiled around the tube 36.

A coiled spring 38 is coupled to the rod 32 and the tube 36. The coiled spring 38 is tensioned as the tube 36 is rotated relative to the rod 32 to extend the cord 24 from the housing 12. The coiled spring 38 rebounds to retract the cord 24 into the interior space 14.

A gear 40 is coupled to and extends radially from the tube 36. The gear 40 is ratchet type. The gear 40 comprises a plurality of teeth 42 that is positioned on a circumference 44 of the gear 40. A pawl 46 has a first terminus 48 that is pivotally coupled to the housing 12 and a second terminus 50 that is pointed. The second terminus 50 is positioned to selectively couple to the gear 40 to prevent rotation of the gear 40 so that the cord 24 is fixedly extended from the housing 12.

A first orifice 52 is positioned through the pawl 46 proximate to the first terminus 48. A spring 54 is coupled to the housing 12 and is positioned in the interior space 14, as shown in FIG. 4. A second orifice 56 is positioned in the front 34 of the housing 12. The second orifice 56 is positioned proximate to the bottom 30 of the housing 12.

A button 58 is coupled to the spring 54. The button 58 extends through the first orifice 52 and the second orifice 56 and protrudes from the housing 12. The button 58 is selectively couplable to the pawl 46. The button 58 is configured to be depressed to decouple the button 58 from the pawl 46 so that the pawl 46 is positioned to pivot relative to the housing 12 to decouple the pawl 46 from the gear 40. The coiled spring 38 is positioned to rebound to rotate the gear 40 to retract the cord 24 into the interior space 14.

A first coupler 60 is coupled to a second end 62 of the cord 24. The first coupler 60 is external to the housing 12. Each of a plurality of adaptors 64 comprises a second coupler 66 and a second plug 68, as shown in FIG. 3. The second coupler 66 is complementary to the first coupler 60. The second coupler 66 is positioned to selectively couple to the first coupler 60 to couple the adaptor 64 to the cord 24.

Figure 6:
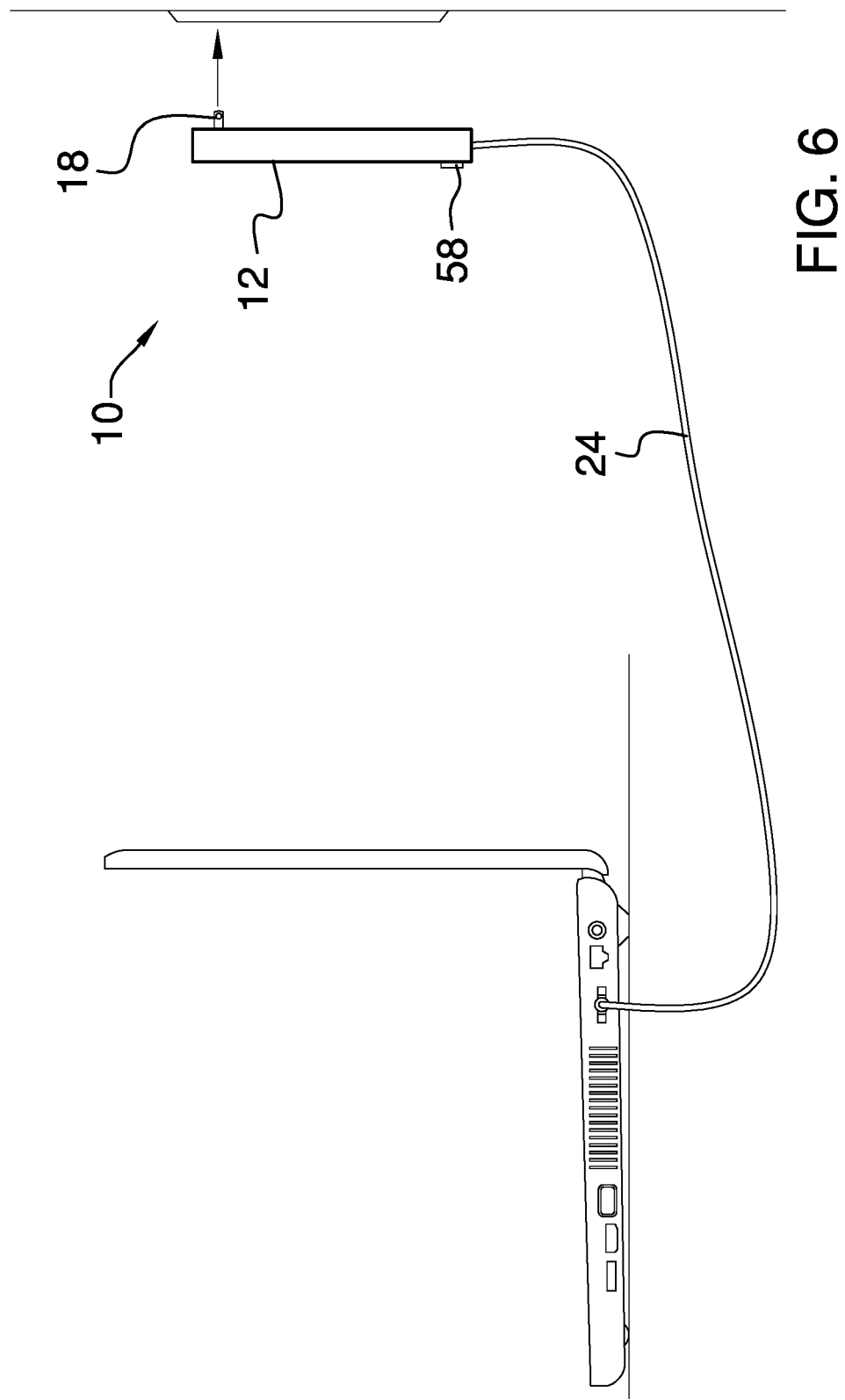
FIG. 6 is an in-use view of an embodiment of the disclosure.

The second plug 68 is complementary to a port that is positioned on a respective electronic device. The second plug 68 is configured to couple the respective electronic device to the power supply unit 16, as shown in FIG. 6. The power supply unit 16 is configured to supply the direct current to power the respective electrical device and to recharge a battery of the respective electrical device. The first coupler 60 and the second coupler 66 comprise a barrel connector 70.

A first bulb 72 is coupled to the front 34 of the housing 12. The first bulb 72 is positioned proximate to the top 22 of the housing 12. The first bulb 72 is operationally coupled to the power supply unit 16. The first bulb 72 is positioned to illuminate when the power supply unit 16 is coupled to the source of alternating current.

A second bulb 74 is coupled to the front 34 the housing 12. The first second is positioned proximate to the top 22 of the housing 12. The second bulb 74 is operationally coupled to the power supply unit 16. The second bulb 74 is positioned to illuminate when the respective electronic device is coupled to the power supply unit 16.

In use, the first plug 18 is configured to couple the housing 12 to the outlet to couple the power supply unit 16 to the source of alternating current. The power supply unit 16 is positioned to convert the alternating current to the direct current. The second plug 68 is configured to couple the respective electronic device to the power supply unit 16 so that the power supply unit 16 is configured to supply the direct current to power the respective electrical device and to recharge the battery of the respective electrical device. The button 58 is configured to be depressed for decouple the button 58 from the pawl 46. The pawl 46 is positioned to pivot relative to the housing 12 to decouple the pawl 46 from the gear 40. The coiled spring 38 is positioned to rebound to rotate the gear 40 to retract the cord 24 into the interior space 14.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A power supply assembly comprising:

a housing defining an interior space;

a power supply unit coupled to said housing and positioned in said interior space, said power supply unit being configured for converting alternating current to direct current;

a first plug coupled to said housing, said first plug being operationally coupled to said power supply unit, said first plug being configured for coupling said housing to an outlet for coupling said power supply unit to a source of alternating current;

a cord positioned in said interior space and selectively extensible from and retractable into said housing, said cord having a first end operationally coupled to said power supply unit;

a first coupler coupled to a second end of said cord such that said first coupler is external to said housing;

a plurality of adaptors, each said adaptor comprising a second coupler and a second plug, said second coupler being complementary to said first coupler such that said second coupler is positioned for selectively coupling to said first coupler for coupling said adaptor to said cord, said second plug being complementary to a port positioned on a respective electronic device;

wherein said second plug is configured for coupling the respective electronic device to said power supply unit wherein said power supply unit is configured supplying the direct current for powering the respective electrical device and for recharging a battery of the respective electrical device;

a first hole positioned through said housing, said cord being positioned through said first hole;

a rod positioned in said interior space, said rod being coupled to and extending between a back and a front of said housing;

a tube positioned around said rod, said cord being coiled around said tube;

a coiled spring coupled to said rod and said tub;

wherein said coiled spring is positioned for tensioning as said tube is rotated relative to said rod for extending said cord from said housing, wherein said coiled spring is positioned for rebounding for retracting said cord into said interior space;

a gear coupled to and extending radially from said tube, said gear being ratchet type;

a pawl having a first terminus and a second terminus, said first terminus being pivotally coupled to said housing, said second terminus being pointed such that said second terminus is positioned for selectively coupling to said gear for preventing rotation of said gear such that said cord is fixedly extended from said housing; and wherein said second end is positioned for selectively coupling to said gear for preventing rotation of said gear such that said cord is fixedly extended from said housing.

2. The assembly of claim 1, further including said housing having a shape selected from the set of shapes consisting of rectangular box shaped and gear shaped.

3. The assembly of claim 1, further including said first plug being pivotally coupled to said housing.

4. The assembly of claim 1, further including said first plug being positioned on a back of said housing proximate to a top of said housing.

5. The assembly of claim 1, further including said gear comprising a plurality of teeth positioned on a circumference of said gear.

6. The assembly of claim 1, further comprising:

a first orifice positioned through said pawl proximate to said first terminus;

a spring coupled to said housing and positioned in said interior space;

a second orifice positioned in said front of said housing;

a button coupled to said spring, said button extending through said first orifice and said second orifice such that said button is selectively couplable to said pawl and wherein said button protrudes from said housing; and wherein said button is configured for depressing for decoupling said button from said pawl such that said pawl is positioned for pivoting relative to said housing for decoupling said pawl from said gear such that said coiled spring is positioned for rebounding for rotating said gear for retracting said cord into said interior space.

7. The assembly of claim 6, further including said second orifice being positioned proximate to a bottom of said housing.

8. The assembly of claim 1, further including said first hole being positioned in a bottom of said housing.

9. The assembly of claim 1, further including said first coupler and said second coupler comprising a barrel connector.

10. The assembly of claim 1, further including a first bulb coupled to a front of said housing, said first bulb being operationally coupled to said power supply unit such that said first bulb is positioned for illuminating when said power supply unit is coupled to the source of alternating current.

11. The assembly of claim 10, further including said first bulb being positioned proximate to a top of said housing.

12. The assembly of claim 1, further including a second bulb coupled to a front said housing, said second bulb being operationally coupled to said power supply unit such that said second bulb is positioned for illuminating when the respective electronic device is coupled to said power supply unit.

13. The assembly of claim 12, further including said second bulb being positioned proximate to a top of said housing.

14. A power supply assembly comprising:

a housing defining an interior space, said housing having a shape selected from the set of shapes consisting of rectangular box shaped and gear shaped;

a power supply unit coupled to said housing and positioned in said interior space, said power supply unit being configured for converting alternating current to direct current;

a first plug coupled to said housing, said first plug being operationally coupled to said power supply unit, said first plug being configured for coupling said housing to an outlet for coupling said power supply unit to a source of alternating current, said first plug being pivotally coupled to said housing, said first plug being positioned on a back of said housing proximate to a top of said housing;

a cord positioned in said interior space and selectively extensible from and retractable into said housing, said cord having a first end operationally coupled to said power supply unit;

a first hole positioned through said housing, said cord being positioned through said first hole, said first hole being positioned in a bottom of said housing;

a rod positioned in said interior space, said rod being coupled to and extending between said back and a front of said housing;

a tube positioned around said rod, said cord being coiled around said tube;

a coiled spring coupled to said rod and said tube wherein said coiled spring is positioned for tensioning as said tube is rotated relative to said rod for extending said cord from said housing, wherein said coiled spring is positioned for rebounding for retracting said cord into said interior space;

a gear coupled to and extending radially from said tube, said gear being ratchet type, said gear comprising a plurality of teeth positioned on a circumference of said gear;

a pawl having a first terminus and a second terminus, said first terminus being pivotally coupled to said housing, said second terminus being pointed such that said second terminus is positioned for selectively coupling to said gear for preventing rotation of said gear such that said cord is fixedly extended from said housing;

a first orifice positioned through said pawl proximate to said first terminus;

a spring coupled to said housing and positioned in said interior space;

a second orifice positioned in said front of said housing, said second orifice being positioned proximate to said bottom of said housing;

a button coupled to said spring, said button extending through said first orifice and said second orifice such that said button is selectively couplable to said pawl and wherein said button protrudes from said housing, wherein said button is configured for depressing for decoupling said button from said pawl such that said pawl is positioned for pivoting relative to said housing for decoupling said pawl from said gear such that said coiled spring is positioned for rebounding for rotating said gear for retracting said cord into said interior space;

a first coupler coupled to a second end of said cord such that said first coupler is external to said housing;

a plurality of adaptors, each said adaptor comprising a second coupler and a second plug, said second coupler being complementary to said first coupler such that said second coupler is positioned for selectively coupling to said first coupler for coupling said adaptor to said cord, said second plug being complementary to a port positioned on a respective electronic device such that said second plug is configured for coupling the respective electronic device to said power supply unit wherein said power supply unit is configured for supplying the direct current for powering the respective electrical device and for recharging a battery of the respective electrical device, said first coupler and said second coupler comprising a barrel connector;

a first bulb coupled to said front of said housing, said first bulb being operationally coupled to said power supply unit such that said first bulb is positioned for illuminating when said power supply unit is coupled to the source of alternating current, said first bulb being positioned proximate to said top of said housing;

a second bulb coupled to said front said housing, said second bulb being operationally coupled to said power supply unit such that said second bulb is positioned for illuminating when the respective electronic device is coupled to said power supply unit, said first second being positioned proximate to said top of said housing; and wherein said first plug is configured for coupling said housing to the outlet for coupling said power supply unit to the source of alternating current positioning said power supply unit for converting the alternating current to the direct current, wherein said second plug is configured for coupling the respective electronic device to said power supply unit wherein said power supply unit is configured for supplying the direct current for powering the respective electrical device and for recharging the battery of the respective electrical device, wherein said button is configured for depressing for decoupling said button from said pawl such that said pawl is positioned for pivoting relative to said housing for decoupling said pawl from said gear such that said coiled spring is positioned for rebounding for rotating said gear for retracting said cord into said interior space.

\* \* \* \* \*